United States Patent
Nakayama et al.

(10) Patent No.: US 10,224,305 B2
(45) Date of Patent: Mar. 5, 2019

(54) SEMICONDUCTOR DEVICE

(71) Applicant: SHARP KABUSHIKI KAISHA, Sakai, Osaka (JP)

(72) Inventors: Masaki Nakayama, Sakai (JP); Motoji Shiota, Sakai (JP); Takashi Matsui, Sakai (JP); Yasuhiko Tanaka, Sakai (JP); Hiroki Miyazaki, Sakai (JP); Seiji Muraoka, Sakai (JP)

(73) Assignee: SHARP KABUSHIKI KAISHA, Sakai, Osaka (JP)

( * ) Notice: Subject to any disclaimer, the term of this patent is extended or adjusted under 35 U.S.C. 154(b) by 0 days.

(21) Appl. No.: 15/576,449

(22) PCT Filed: May 18, 2016

(86) PCT No.: PCT/JP2016/064766
§ 371 (c)(1),
(2) Date: Nov. 22, 2017

(87) PCT Pub. No.: WO2016/190197
PCT Pub. Date: Dec. 1, 2016

(65) Prior Publication Data
US 2018/0158795 A1   Jun. 7, 2018

(30) Foreign Application Priority Data
May 22, 2015 (JP) ................. 2015-104878

(51) Int. Cl.
*H01L 23/00*   (2006.01)
*H01L 27/12*   (2006.01)
*G02F 1/1345*   (2006.01)

(52) U.S. Cl.
CPC .......... *H01L 24/73* (2013.01); *G02F 1/13454* (2013.01); *G02F 1/13458* (2013.01);
(Continued)

(58) Field of Classification Search
None
See application file for complete search history.

(56) References Cited

U.S. PATENT DOCUMENTS 6,043,670 A * 3/2000 Degani ............. G01R 31/2886
257/E21.514
2002/0080318 A1   6/2002 Yamate et al.
(Continued)

FOREIGN PATENT DOCUMENTS

JP     3781967 B2    6/2006
JP     2007-335607 A    12/2007

*Primary Examiner* — Dung Le
(74) *Attorney, Agent, or Firm* — ScienBiziP, P.C.

(57) ABSTRACT

In order to inhibit defective connection between a bump of a semiconductor chip and an electrode pad of a substrate, a semiconductor device includes a substrate provided on a surface with a plurality of electrode pads 15, a semiconductor chip 20 provided on a surface with a plurality of bumps 21 substantially equal in size, and an anisotropic conductive film 30 interposed between the plurality of bumps 21 and the plurality of electrode pads 15 and electrically connecting each of the bumps 21 and corresponding one of the electrode pads 15. The plurality of electrode pads 15 includes a plurality of first electrode pads 15A positioned closest to an end 25 of the semiconductor chip 20, and a plurality of second electrode pads 15B positioned inside the plurality of first electrode pads 15A on the semiconductor chip 20. Each of the second electrode pads 15B is larger in area than each of the first electrode pads 15A.

6 Claims, 5 Drawing Sheets

(52) U.S. Cl.
CPC .............. *H01L 24/16* (2013.01); *H01L 24/32* (2013.01); *H01L 27/124* (2013.01); *H01L 2224/16227* (2013.01); *H01L 2224/32227* (2013.01); *H01L 2224/73204* (2013.01); *H01L 2224/8319* (2013.01); *H01L 2924/1426* (2013.01)

(56) References Cited

U.S. PATENT DOCUMENTS

| | | | |
|---|---|---|---|
| 2002/0100974 A1* | 8/2002 | Uchiyama | H01L 24/11 257/737 |
| 2007/0290302 A1 | 12/2007 | Nakagawa et al. | |
| 2008/0054460 A1* | 3/2008 | Hung | H01L 21/563 257/737 |
| 2011/0074047 A1* | 3/2011 | Pendse | H01L 21/563 257/782 |

* cited by examiner

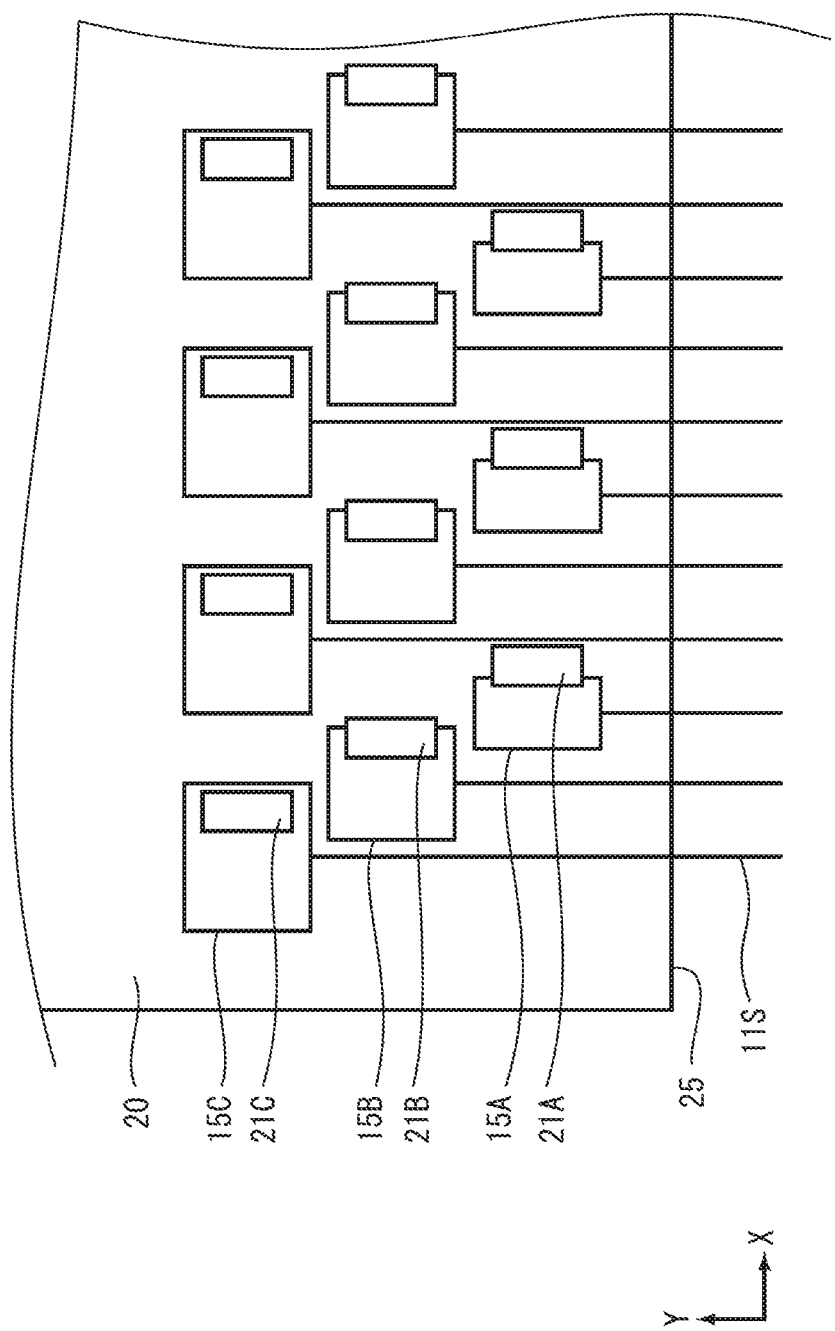

SEMICONDUCTOR DEVICE

TECHNICAL FIELD

The present invention relates to a semiconductor device.

BACKGROUND ART

There has been known a technique (chip on glass (COG)) of mounting a semiconductor chip having a lower surface provided with a plurality of bumps, on a substrate with an anisotropic conductive film interposed therebetween.

Patent Literature 1 discloses a configuration in which a plurality of bumps provided on a semiconductor chip includes first bumps arrayed close to a chip end surface and connected to first terminals provided on a substrate, and second bumps arrayed far from the chip end surface (closer to the innermost portion of the chip) and connected to second terminals provided on the substrate. In the configuration disclosed in Patent Literature 1, the second bumps are larger in area than the first bumps and the second terminals are larger in area than the first terminals. This configuration allows, upon mounting in accordance with the COG technique, conductive particles captured by the first bumps arrayed close to the chip end surface and the first terminals to be substantially equal in number to conductive particles captured by the second bumps arrayed far from the chip end surface and the second terminals, to inhibit defective connection between the second bumps and terminal areas connected thereto.

CITATION LIST

Patent Literature

Patent Literature 1: JP 3781967 B1

SUMMARY OF INVENTION

Technical Problem

The configuration described in Patent Literature 1 includes the second bumps larger than the first bumps, and may thus have unequal pressure applied to the bumps different in size upon mounting of the semiconductor chip to cause defective connection.

It is an object of the present invention to provide a technique for inhibition of defective connection between a bump of a semiconductor chip and an electrode pad of a substrate.

Solution to Problem

According to an embodiment of the present invention, a semiconductor device includes: a substrate provided on a surface with a plurality of electrode pads; a semiconductor chip provided on a surface with a plurality of bumps substantially equal in size; and an anisotropic conductive film interposed between the plurality of bumps and the plurality of electrode pads and electrically connecting each of the bumps and corresponding one of the electrode pads; in which the plurality of electrode pads includes a plurality of first electrode pads positioned closest to an end of the semiconductor chip, and a plurality of second electrode pads positioned inside the plurality of first electrode pads on the semiconductor chip, and each of the second electrode pads is larger in area than each of the first electrode pads.

Advantageous Effect of Invention

The present invention achieves inhibition of defective connection between a bump of a semiconductor chip and an electrode pad of a substrate.

BRIEF DESCRIPTION OF DRAWINGS

FIG. 5 is a diagram depicting positional relations between the electrode pads of the substrate and the bumps of the semiconductor chip displaced from each other in the semiconductor device according to the embodiment.

DESCRIPTION OF EMBODIMENTS

Figure 1:
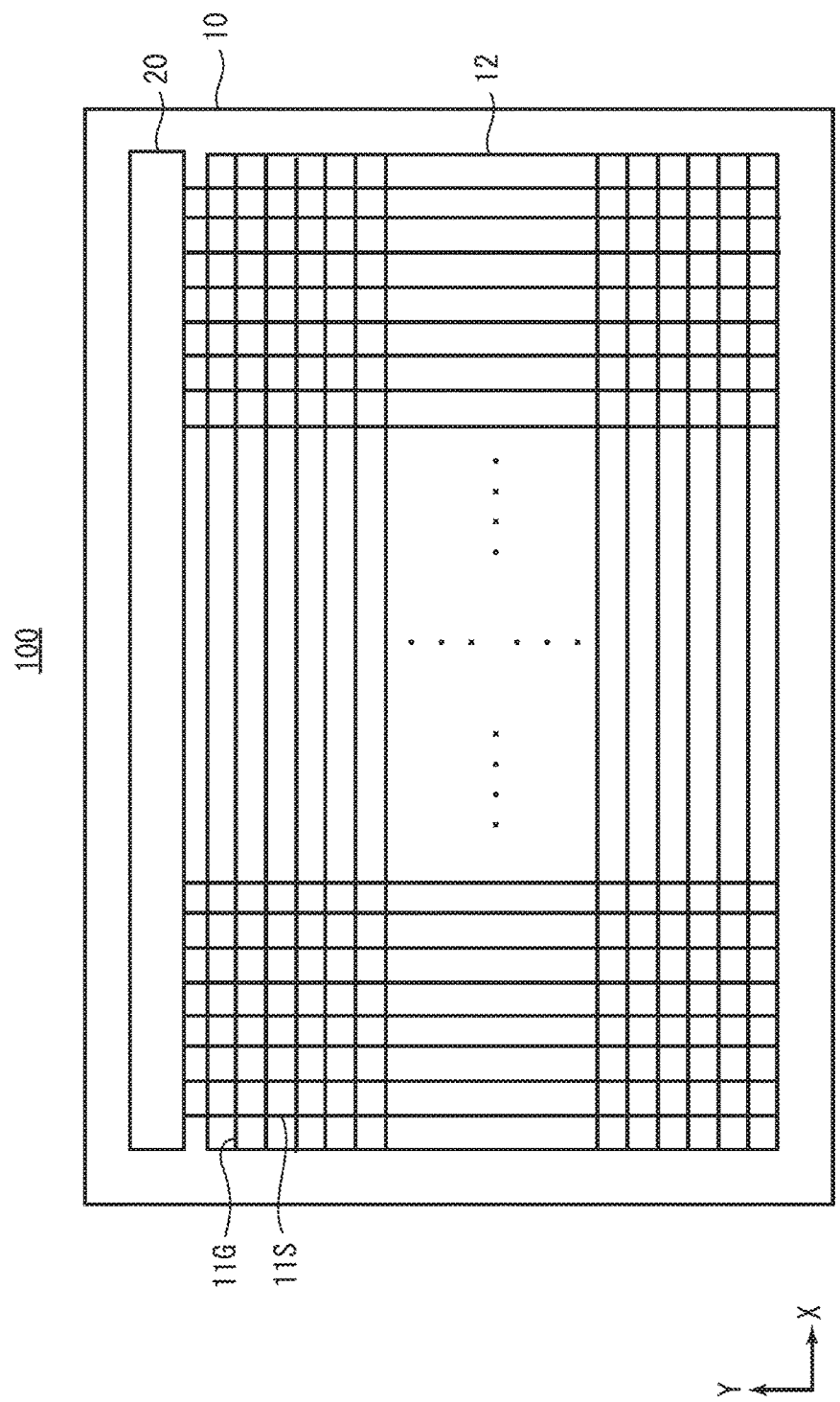
FIG. 1 is a schematic configuration diagram of a liquid crystal display including a semiconductor device according to an embodiment.

According to an embodiment of the present invention, a semiconductor device includes: a substrate having a plurality of electrode pads on a surface thereof; a semiconductor chip having a plurality of bumps substantially equal in size on a surface thereof; and an anisotropic conductive film interposed between the plurality of bumps and the plurality of electrode pads and electrically connecting each of the bumps and corresponding one of the electrode pads; in which the plurality of electrode pads includes a plurality of end electrode pads positioned closest to an end of the semiconductor chip, and a plurality of inner electrode pads positioned inside the plurality of end electrode pads on the semiconductor chip, and each of the inner electrode pads is larger in area than each of the end electrode pads (a first configuration).

In the first configuration, each of the inner electrode pads positioned closer to the innermost portion of the semiconductor chip is larger in area than each of the end electrode pads positioned closest to the end of the semiconductor chip, to inhibit detective connection between the inner electrode pads positioned closer to the innermost portion and having low trap rates of conductive particles in the anisotropic conductive film and the corresponding bumps of the semiconductor chip. The plurality of bumps substantially equal in size receives equal pressure upon mounting of the semiconductor chip, to achieve inhibition of defective connection between the bumps of the semiconductor chip and the electrode pads of the substrate.

Optionally, in the first configuration, the plurality of inner electrode pads includes a plurality of first inner electrode pads, and a plurality of second inner electrode pads positioned inside the plurality of first inner electrode pads on the semiconductor chip, and each of the second inner electrode pads is not smaller in area than each of the first inner electrode pads (a second configuration).

Even in the case where the plurality of inner electrode pads disposed on the substrate includes the end electrode pads, the first inner electrode pads, and the second inner electrode pads aligned from the end toward the innermost portion of the semiconductor chip, the second configuration inhibits defective connection between the second inner electrode pads having low trap rates of conductive particles in the anisotropic conductive film and the corresponding bumps of the semiconductor chip. Furthermore, the plurality of bumps is substantially equal in size to more effectively inhibit current leakage between the bumps adjacent to each other, in comparison to a configuration including bumps partially larger in size to be less distant from each other.

Optionally, in the second configuration, the plurality of inner electrode pads includes a plurality of third inner electrode pads positioned inside the plurality of second inner electrode pads on the semiconductor chip, and each of the third inner electrode pads is not smaller in area than each of the second inner electrode pads (a third configuration).

Even in the case where inner electrodes include the plurality of third inner electrode pads positioned inside the second inner electrode pads on the semiconductor chip, the third configuration inhibits defective connection between the third inner electrode pads having low trap rates of conductive particles in the anisotropic conductive film and the corresponding bumps of the semiconductor chip. Furthermore, the plurality of bumps is substantially equal in size to more effectively inhibit current leakage between the bumps adjacent to each other, in comparison to a configuration including bumps partially larger in size to be less distant from each other.

Optionally, in the third configuration, the plurality of inner electrode pads further includes a plurality of electrode pads positioned inside the plurality of third inner electrode pads on the semiconductor chip (a fourth configuration).

Even in the case where the inner electrode pads aligned in at least four rows are provided inside the end electrode pads on the semiconductor chip, the fourth configuration inhibits defective connection between the inner electrode pads positioned closer to the innermost portion of the semiconductor chip and the corresponding bumps of the semiconductor chip.

Optionally, in any one of the first to fourth configurations, the inner electrode pads positioned closer to an innermost portion of the semiconductor chip have larger areas (a fifth configuration).

The fifth configuration inhibits defective connection between the inner electrode pads having low trap rates of conductive particles in the anisotropic conductive film and the corresponding bumps of the semiconductor chip. Furthermore, the plurality of bumps is substantially equal in size to more effectively inhibit current leakage between the bumps adjacent to each other, in comparison to a configuration including bumps partially larger in size to be less distant from each other.

Optionally, in any one of the first to fifth configurations, in the inner electrode pads, each of the inner electrode pads at least partially located within a range of a length corresponding to 30% of a short side width from the center in a short side direction of the semiconductor chip is larger in area than each of the end electrode pads (a sixth configuration).

The sixth configuration inhibits defective connection between the inner electrode pads at least partially located within the range of the length corresponding to 30% of the short side width from the center in the short side direction of the semiconductor chip and having particularly low trap rates of conductive particles 31 and the corresponding bumps of the semiconductor chip. Furthermore, cost reduction is achieved in a case where the inner electrode pads not positioned within the range of the length corresponding to 30% of the short side width from the center in the short side direction of the semiconductor chip are made equal in area to the end electrode pads or the like, in comparison to a case where these inner electrode pads are made larger in area than the end electrode pads.

Optionally, in any one of the first to sixth configurations, the bumps adjacent to each other are distant substantially equally in an alignment direction of the plurality of end electrode pads (a seventh configuration).

The seventh configuration inhibits increase in current leakage between the bumps adjacent to each other.

Embodiment

An embodiment of the present invention will be described in detail below with reference to the drawings. Identical or corresponding portions in the drawings will be denoted by identical reference signs and will not be described repeatedly. For clearer description, the drawings to be referred to hereinafter may depict simplified or schematic configurations or may not depict some of constructional elements. The constructional elements in each of the drawings may not necessarily be depicted in actual dimensional ratios.

Described below is exemplary application of a semiconductor device according to an embodiment to a liquid crystal display. The present invention is, however, not limitedly applied to such a liquid crystal display, but is applicable to a different type of a display like an organic EL display, electronic equipment other than displays, and the like, each of which includes a semiconductor chip provided on a lower surface with a plurality of bumps and mounted on a substrate with an anisotropic conductive film interposed therebetween.

FIG. 1 is a schematic configuration diagram of a liquid crystal display 100 including the semiconductor device according to the embodiment. The semiconductor device according to the embodiment is configured as an active matrix substrate including a substrate 10 and a semiconductor chip 20. The semiconductor device is, however, not limited to such an active matrix substrate.

The substrate 10 is provided with a plurality of gate lines 11G extending in an X-axis direction and aligned at a predetermined interval in a Y-axis direction. The substrate 10 is also provided with a plurality of source lines (data lines) 11S extending in the Y-axis direction and aligned at a predetermined interval in the X-axis direction. The gate lines 11G and the source lines 11S surround rectangular areas functioning as pixel areas, which collectively configure a display area 12.

The gate lines 11G and the source lines 11S have intersections, each of which is adjacent to a thin film transistor (TFT) (not depicted) configured to control display at a corresponding pixel. The pixels each correspond to a color filter of red (R), green (G), or blue (B). The three adjacent pixels corresponding to the color filters of red (R), green (G), and blue (B) configure a single display pixel enabling display in various colors.

The semiconductor chip 20 according to the present embodiment is configured as a source driver. The semiconductor chip 20 configured as the source driver is disposed outside the display area 12. The semiconductor chip 20 is connected to the source lines 11S and outputs a data signal to each of the source lines 11S.

The gate lines 11G are each connected to a gate driver (not depicted). The gate driver outputs, to corresponding one of the gate lines 11G a voltage signal indicating one of a selected state and a non-selected state.

The liquid crystal display includes the substrate 10, a counter substrate (not depicted), and a liquid crystal layer (not depicted) sandwiched therebetween.

Figure 2:
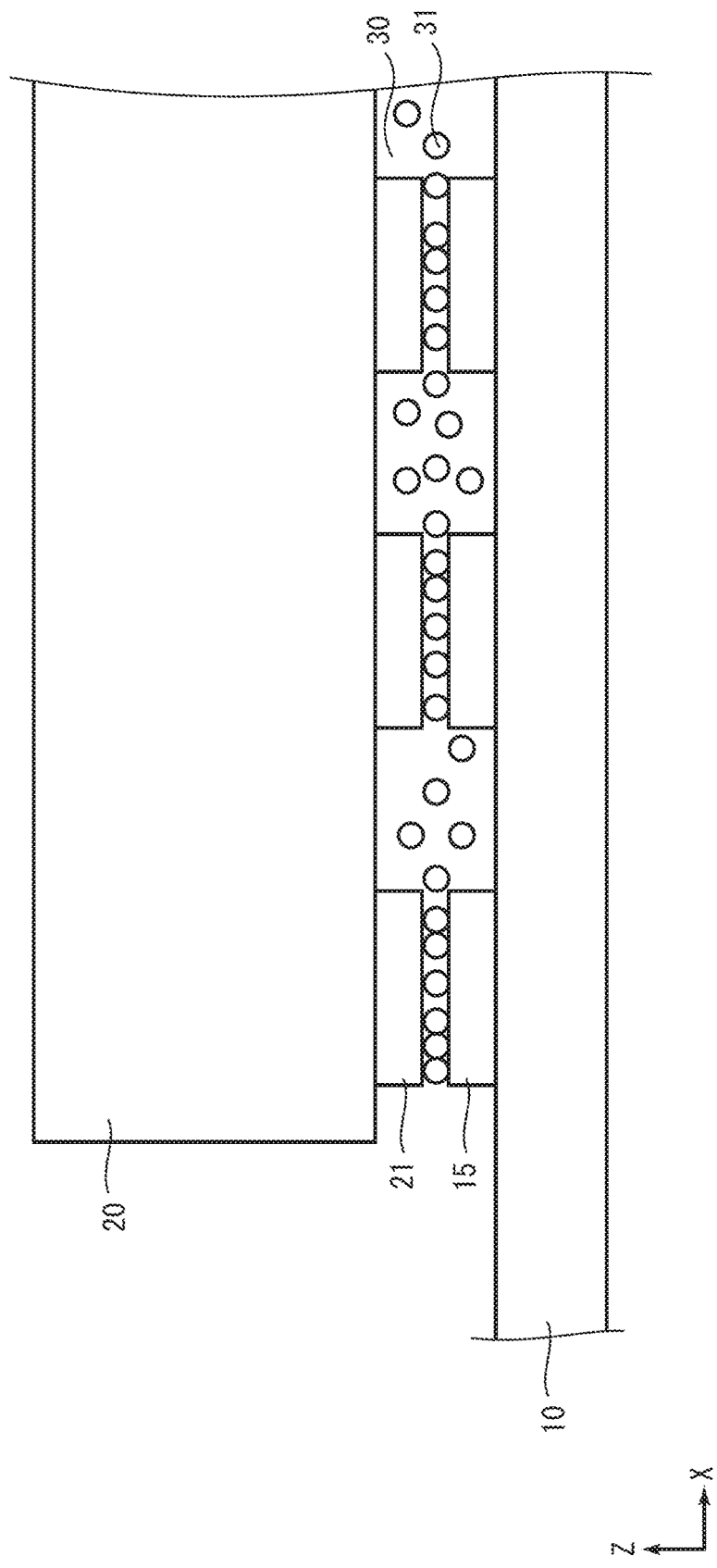
FIG. 2 is an enlarged sectional view of a portion connecting a substrate and a semiconductor chip.

FIG. 2 is an enlarged sectional view of a portion connecting the substrate 10 and the semiconductor chip 20. As depicted in FIG. 2, the semiconductor chip 20 has a surface provided with a plurality of bumps 21 functioning as bump electrodes. The substrate 10 has a surface provided with a plurality of electrode pads 15 equal in number to the bumps 21 of the semiconductor chip 20. The electrode pads 15 are each connected to corresponding one of the source lines 11S.

The semiconductor chip 20 having the surface provided with the bumps 21 directed downward is mounted on the substrate 10 with an anisotropic conductive film 30 interposed therebetween. Briefly, in order to mount the semiconductor chip 20, in a state where the plurality of bumps 21 of the semiconductor chip 20 faces the plurality of electrode pads 15 of the substrate 10 with the anisotropic conductive film 30 interposed therebetween, the semiconductor chip 20 is pressurized from upward for pressure joining. The bumps 21 of the semiconductor chip 20 are thus electrically connected to the electrode pads 15 of the substrate 10 via conductive particles 31 included in the anisotropic conductive film 30. Each of the bumps 21 of the semiconductor chip 20 is accordingly electrically connect to corresponding one of the source lines 11S.

Figure 3:
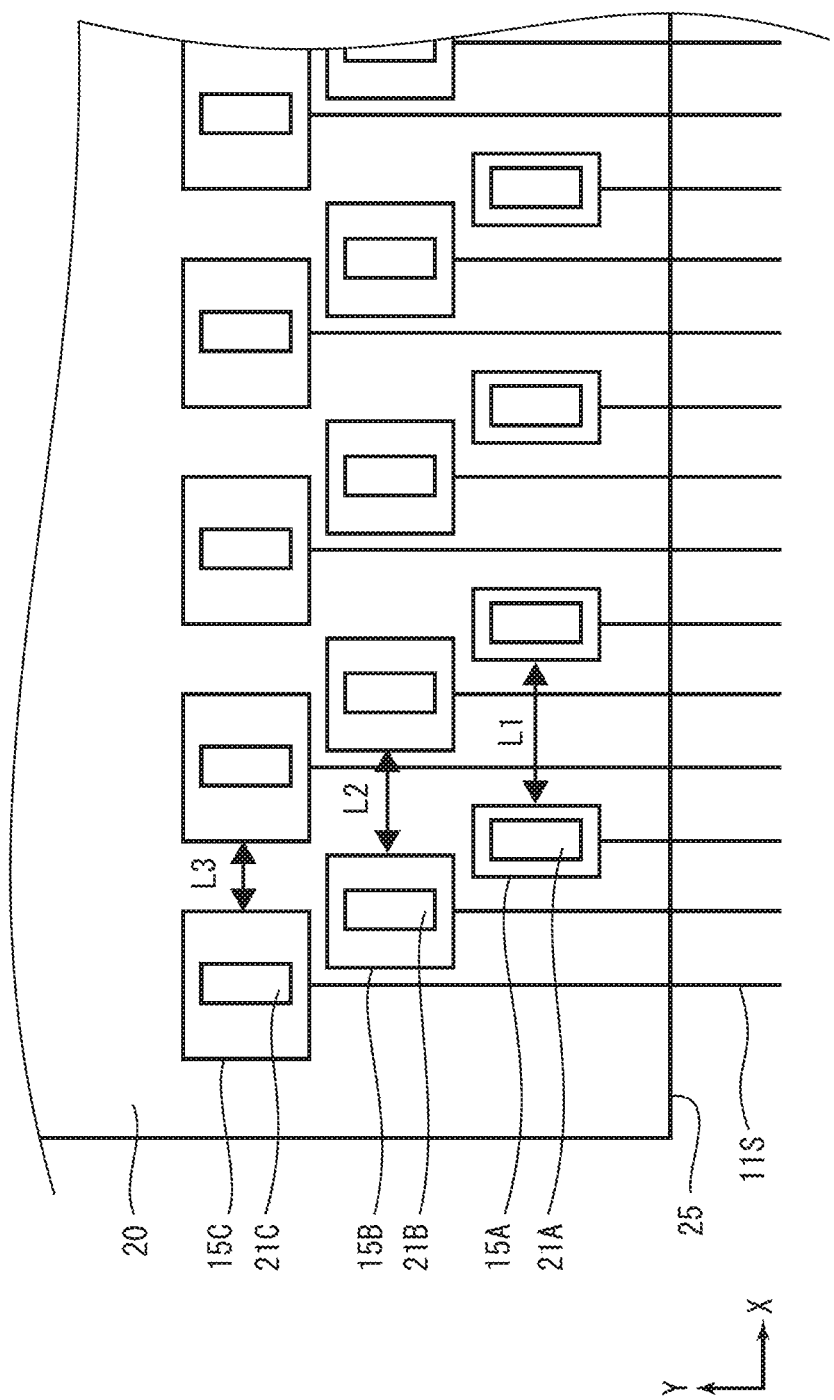
FIG. 3 is an explanatory diagram depicting locations and sizes of electrode pads of the substrate and bumps of the semiconductor chip.

FIG. 3 is an explanatory diagram depicting locations and sizes of the electrode pads 15 of the substrate 10 and the bumps 21 of the semiconductor chip 20.

The electrode pads 15 include first electrode pads 15A, second electrode pads 15B, and third electrode pads 15C mounted on the semiconductor chip 20 and aligned, in the mentioned order, from a portion closest to an end 25 of the semiconductor chip 20 to a portion farther from the end 25 (toward the innermost portion of the semiconductor chip 20). The end 25 of the semiconductor chip 20 corresponds to a long side overlapped with the source lines 11S, out of the four sides of the rectangular semiconductor chip 20.

The first electrode pads 15A are called end electrode pads positioned closest to the end 25 of the semiconductor chip 20 and are aligned at a first interval L1 in the X-axis direction parallel to a longitudinal direction of the semiconductor chip 20. The second electrode pads 15B are positioned inside the first electrode pads 15A on the semiconductor chip 20 and are aligned at a second interval L2 in the X-axis direction. The third electrode pads 15C are positioned inside the second electrode pads 15B on the semiconductor chip 20 and are aligned at a third interval L3 in the X-axis direction. The second electrode pads 15B and the third electrode pads 15C are called inner electrode pads positioned inside the first electrode pads 15A called the end electrode pads on the semiconductor chip 20.

The electrode pads 15A to 15C are aligned in the X-axis direction in the order of the electrode pads 15C, 15B, and 15A to form a so-called staggered pattern.

The second electrode pads 15B are larger than the first electrode pads 15A. The third electrode pads 15C are also larger than the first electrode pads 15A. Specifically, the second electrode pads 15B and the third electrode pads 15C, which are positioned inside the first electrode pads 15A closest to the end 25 of the semiconductor chip 20, are larger than the first electrode pads 15A.

The third electrode pads 15C are larger than the second electrode pads 15B in the present embodiment. Specifically, the first electrode pads 15A positioned closest to the end 25 of the semiconductor chip 20 are the smallest, whereas the third electrode pads 15C positioned farthest from the end 25 of the semiconductor chip 20 (in the innermost portion of the semiconductor chip 20) are the largest.

In a case where the electrode pads 15A, 15B, and 15C each include a metal layer or the like and a transparent electrode provided on the metal layer, only the transparent electrodes of the electrode pads 15A, 15B, and 15C can be differentiated in size while the metal layers thereof are equal in size. Specifically, the transparent electrodes configuring the first electrode pads 15A positioned closest to the end 25 of the semiconductor chip 20 can be the smallest, whereas the transparent electrodes configuring the third electrode pads 15C positioned farthest from the end 25 of the semiconductor chip 20 (in the innermost portion of the semiconductor chip 20) can be the largest.

The source lines 11S adjacent to each other in the X-axis direction are distant at substantially equal intervals, so that the first interval L1 in the X-axis direction between the first electrode pads 15A are the largest whereas the third interval L3 in the X-axis direction between the third electrode pads 15C are the smallest.

The plurality of bumps 21 provided on the semiconductor chip 20 includes a plurality of first bumps 21A positioned closest to the end 25 of the semiconductor chip 20, a plurality of second bumps 21B positioned inside the first bumps 21A on the semiconductor chip 20, and a plurality of third bumps 21C positioned inside the second bumps 21B on the semiconductor chip 20.

Each of the first bumps 21A is electrically connected to corresponding one of the first electrode pads 15A. Each of the second bumps 21B is electrically connected to corresponding one of the second electrode pads 15B. Each of the third bumps 21C is electrically connected to corresponding one of the third electrode pads 15C.

The first bumps 21A, the second bumps 21B, and the third bumps 21C are substantially equal in size. The source lines 11S adjacent to each other in the X-axis direction are distant substantially equally, so that the distance between the adjacent first bumps 21A, the distance between the adjacent second bumps 21B, and the distance between the adjacent third bumps 21C are all substantially equal in the X-axis direction.

Described below are why the second electrode pads 15B are made larger than the first electrode pads 15A and why the third electrode pads 15C are made larger than the second electrode pads 15B.

In order to mount the semiconductor chip 20 on the substrate 10 in accordance with the COG technique, the semiconductor chip 20 is pressurized from upward in the state where the plurality of bumps 21 of the semiconductor chip 20 faces the plurality of electrode pads 15 of the substrate 10 with the anisotropic conductive film 30 interposed therebetween, as described earlier. Excessive resin between the substrate 10 and the semiconductor chip 20 is thus pushed away and the bumps 21 of the semiconductor chip 20 are pressure joined to the electrode pads 15 of the substrate 10.

In this case, resin around the bumps 21B and 21C positioned inside the end 25 of the semiconductor chip 20 is more likely to be pressed uniformly in the plane than resin around the bumps 21A positioned closest to the end 25 of the semiconductor chip 20, and the conductive particles shift in parallel with the plane of the substrate 10.

The resin pushed out of the semiconductor chip 20 inhibits the flow of resin close to the end 25 of the semiconductor chip 20 and thus decreases flow speed thereof.

Accordingly, resin moving from below the bumps 21 is transitionally decreased in comparison to resin moving to below the bumps 21 in the portion close to the end 25 of the semiconductor chip 20. The conductive particles 31 remaining between the electrode pads 15 and the bumps 21 in the portion close to the end 25 of the semiconductor chip 20 are thus more than the conductive particles 31 positioned closer to the innermost portion of the semiconductor chip 20.

The bumps positioned closer to the innermost portion of the semiconductor chip have lower trap rates of the conductive particles 31. In the configuration according to the present embodiment, the bumps 21B positioned inside the bumps 21A closest to the end 25 of the semiconductor chip 20 have lower trap rates of the conductive particles 31 than the bumps 21A. The bumps 21C positioned inside the bumps 21B have still lower trap rates of the conductive particles 31 than the bumps 21B.

If the electrode pads 15 of the substrate 10 are displaced from the bumps 21 of the semiconductor chip 20 upon mounting of the semiconductor chip 20, the inner bumps having low trap rates of the conductive particles 31 and the corresponding electrode pads 15 may have defective connection. This will be described with reference to FIG. 4.

Figure 4:
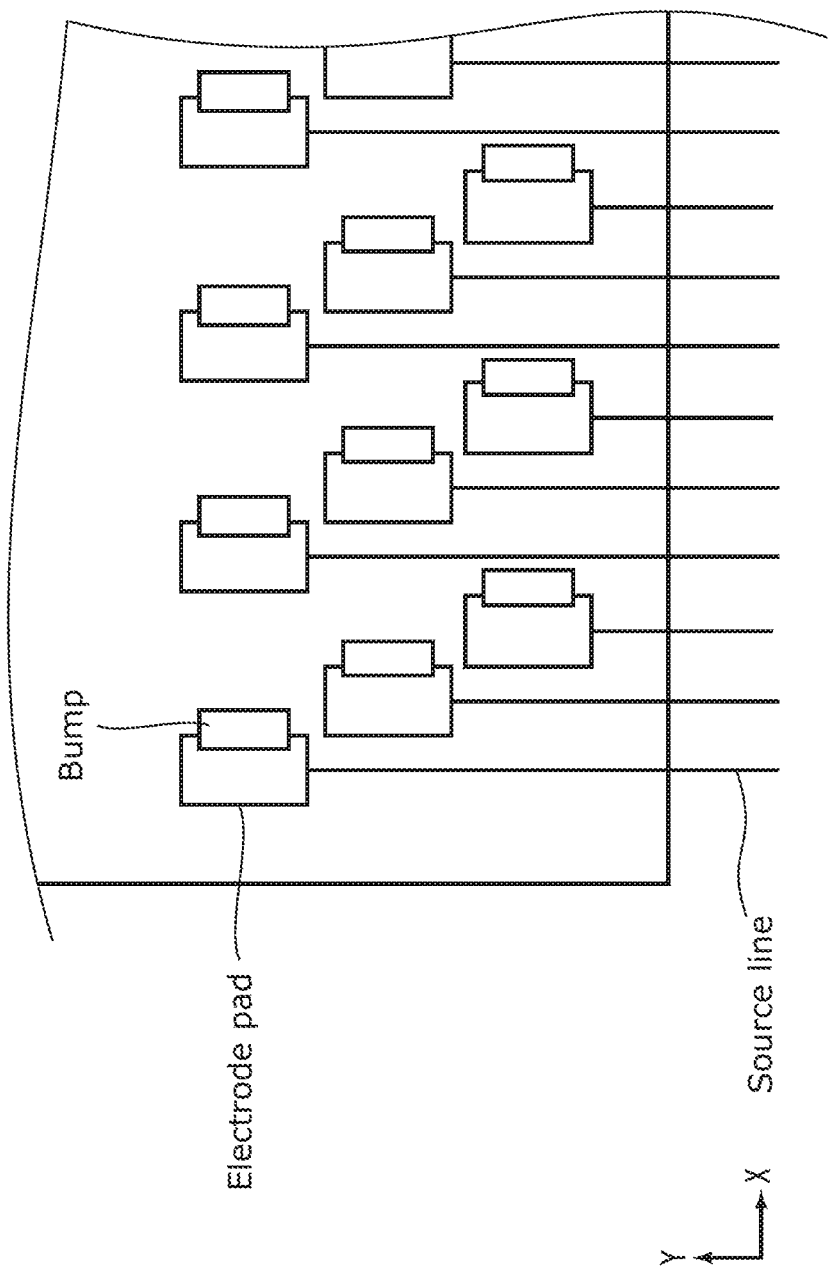
FIG. 4 is a diagram depicting positional relations between electrode pads of a substrate and bumps of a semiconductor chip displaced from each other in a conventional configuration including the electrode pads equal in size.

FIG. 4 is a diagram depicting positional relations between electrode pads of a substrate and bumps of a semiconductor chip displaced from each other in a conventional configuration including the electrode pads equal in size. FIG. 4 exemplifies the bumps displaced from the electrode pads in the X-axis direction.

When the electrode pads equal in size and the bumps are displaced from each other, the electrode pads and the bumps have equal connection areas regardless of the positions of the electrode pads. In this case, the bumps positioned closer to the innermost portion and having low trap rates of the conductive particles and the corresponding electrode pads may have defective connection.

In contrast, the second electrode pads 15B positioned inside the first electrode pads 15A on the semiconductor chip 20 are made larger than the first electrode pads 15A in the present embodiment. Furthermore, the third electrode pads 15C positioned inside the second electrode pads 15B on the semiconductor chip 20 are made larger than the second electrode pads 15B. Even if the electrode pads 15 of the substrate 10 and the bumps 21 of the semiconductor chip 20 are displaced from each other, this configuration inhibits defective connection between the inner bumps 21 and the corresponding electrode pads 15.

FIG. 5 is a diagram depicting positional relations between the electrode pads 15 of the substrate 10 and the bumps 21 of the semiconductor chip 20 displaced from each other in the configuration according to the present embodiment. FIG. 5 also exemplifies the bumps 21 displaced from the electrode pads 15 in the X-axis direction.

As depicted in FIG. 5, the electrode pads 15 positioned farther from the end 25 of the semiconductor chip 20 (closer to the innermost portion of the semiconductor chip 20) are larger in size. The larger electrode pads 15 and the bumps 21 of the semiconductor chip 20 thus have large connection areas even when the electrode pads 15 and the bumps 21 are displaced from each other. Specifically, the electrode pads 15C and the bumps 21C have the largest connection areas, and the electrode pads 15B and the bumps 21B have the second largest connection areas. The electrode pads 15A closest to the end 25 of the semiconductor chip 20 and the bumps 21A have the smallest connection areas.

When the electrode pads 15 of the substrate 10 and the bumps 21 of the semiconductor chip 20 are displaced from each other, such a configuration secures the larger connection areas between the electrode pads 15 and the bumps 21 positioned closer to the innermost portion of the semiconductor chip 20 and having lower trap rates pf the conductive particles 31, to effectively inhibit detective connection between the inner bumps 21 and the electrode pads 15.

The plurality of bumps 21 of the semiconductor chip 20 is substantially equal in size. Accordingly, the bumps 21 will not receive unequal pressure when the semiconductor chip 20 is pressurized from thereabove upon mounting of the semiconductor chip 20. The bumps 21 and the corresponding electrode pads 15 can thus be joined with equal pressure, to inhibit defective connection between the bumps 21 and the corresponding electrode pads 15.

Furthermore, the adjacent bumps 21 are substantially equally distant from each other in the X-axis direction parallel to the longitudinal direction of the semiconductor chip 20, which will not increase probability of current leakage between the bumps 21 adjacent to each other.

In a case where the bumps closer to the innermost portion of the semiconductor chip are made larger than the bumps closer to the end of the semiconductor chip, the inner bumps have shorter distance therebetween and have lower flowability of the conductive particles in the anisotropic conductive film upon mounting of the semiconductor chip. In contrast, the semiconductor device according to the present embodiment includes the adjacent bumps substantially equally distant from each other and will thus not cause such decrease in flowability of the conductive particles 31.

The configuration including the larger bumps positioned closer to the innermost portion of the semiconductor chip requires increase in amount of metal for the bumps and thus causes increase in cost for the semiconductor chip 20. Furthermore, this configuration requires increase in pressure applied from above the semiconductor chip upon mounting of the semiconductor chip and thus causes increase in cost.

In contrast, the semiconductor device according to the present embodiment includes the electrode pads 15B and 15C positioned inside the end 25 of the semiconductor chip 20 and being larger than the electrode pads 15A positioned closest to the end 25 of the semiconductor chip 20, while the bumps 21 of the semiconductor chip 20 are substantially equal in size regardless of their positions. This configuration thus inhibits increase in cost for the semiconductor chip 20. Furthermore, this configuration does not require increase in pressure applied from above the semiconductor chip 20 upon mounting of the semiconductor chip 20 and thus causes no increase in cost.

As described above, the semiconductor device according to the embodiment of the present invention includes the plurality of electrode pads disposed on the substrate. The plurality of electrode pads includes the plurality of end electrode pads positioned closest to the end of the semiconductor chip, and the plurality of inner electrode pads positioned inside the plurality of end electrode pads on the semiconductor chip. Each of the inner electrode pads is made larger in area than each of the end electrode pads to inhibit defective connection between the bumps of the semiconductor chip and the electrode pads of the substrate.

The present invention should not be limited to the embodiment described above. For example, the above embodiment exemplifies the bumps 21 of the semiconductor chip 20 aligned in the three rows from the end 25 toward the innermost portion of the semiconductor chip 20. The bumps 21 can alternatively be aligned in two rows, or in four or more rows.

The above embodiment exemplifies the third electrode pads 15C larger than the second electrode pads 15B. The second electrode pads 15B can alternatively be larger than the third electrode pads 15C. The third electrode pads 15C are still larger than the electrode pads 15A positioned closest to the end 25 of the semiconductor chip 20 even in such a case. The third electrode pads 15C are preferred to be not smaller than the second electrode pads 15B and are more preferred to be larger than the second electrode pads 15B for the above reason and for effective use of the space on the substrate 10.

In addition to the first to third electrode pads 15A to 15C, there can optionally be provided fourth electrode pads positioned inside the third electrode pads 15C on the semiconductor chip 20. Even in this case, the electrode pads positioned inside the first electrode pads 15A closest to the end of the semiconductor chip are larger than the first electrode pads 15A. In this case, the fourth electrode pad are preferred to be not smaller in area than the third electrode pads 15C, and are more preferred to be larger in area than the third electrode pads 15C. Specifically, the fourth electrode pads are preferred to be not smaller in area than the third electrode pads 15C, and the third electrode pads are preferred to be not smaller than the second electrode pads 15C. More preferably, the fourth electrode pads are larger in area than the third electrode pads 15C, and the third electrode pads are larger in area than the second electrode pads 15C.

There can further be provided electrode pads positioned inside the fourth electrode pads on the semiconductor chip 20. In this case, the electrode pads electrically connected to the bumps disposed closer to the innermost portion are preferred to be larger in area for the above reason.

The inventors have conducted a test to find that the bumps 21 positioned closer to the innermost portion of the semiconductor chip 20 have lower trap rates of the conductive particles 31, and the trap rates of the conductive particles 31 are particularly low in a range of the length corresponding to 30% of a short side width from the center in a short side direction of the semiconductor chip 20. Accordingly, the electrode pads 15, which are at least partially located within the range of the length corresponding to 30% of the short side width from the center in the short side direction of the semiconductor chip 20, can be made larger in area than the first electrode pads 15A positioned closest to the end of the semiconductor chip. The range of the length corresponding to 30% of the short side width from the center in the short side direction of the semiconductor chip 20 includes the range of the length corresponding to 30% of the short side width in each direction along the short side from the center in the short side direction of the semiconductor chip 20.

The adjacent bumps 21 are not necessarily substantially equally distant from each other in the longitudinal direction (the X-axis direction) of the semiconductor chip 20. In a case where the adjacent bumps 21 are unequally distant from each other, the bumps 21 closer to each other are more likely to have current leakage and are decreased in flowability of the conductive particles upon mounting of the semiconductor chip 20 as described above. The adjacent bumps 21 are thus preferred to be substantially equally distant from each other.

REFERENCE SIGN LIST

10 Substrate
11G Gate line
11S Source line
15, 15A, 15B, and 15C Electrode pad
20 Semiconductor chip
21, 21A, 21B, and 21C Bump
30 Anisotropic conductive film
31 Conductive particle
100 Semiconductor device

The invention claimed is:

1. A semiconductor device comprising:
a substrate including a plurality of electrode pads on a surface thereof;
a semiconductor chip including a plurality of bumps substantially equal in size on a surface thereof; and
an anisotropic conductive film interposed between the plurality of bumps and the plurality of electrode pads and electrically connecting each of the bumps and corresponding one of the electrode pads; wherein
the plurality of electrode pads includes a plurality of end electrode pads positioned closest to an end of the semiconductor chip, and a plurality of inner electrode pads positioned inside the plurality of end electrode pads on the semiconductor chip, and each of the inner electrode pads is larger in area than each of the end electrode pads;
wherein, in the inner electrode pads, each of the inner electrode pads at least partially located within a range of a length corresponding to 30% of a short side width from the center in a short side direction of the semiconductor chip is larger in area than each of the end electrode pads.

2. The semiconductor device according to claim 1, wherein the plurality of inner electrode pads includes a plurality of first inner electrode pads, and a plurality of second inner electrode pads positioned inside the plurality of first inner electrode pads on the semiconductor chip, and each of the second inner electrode pads is not smaller in area than each of the first inner electrode pads.

3. The semiconductor device according to claim 2, wherein the plurality of inner electrode pads includes a plurality of third inner electrode pads positioned inside the plurality of second inner electrode pads on the semiconductor chip, and each of the third inner electrode pads is not smaller in area than each of the second inner electrode pads.

4. The semiconductor device according to claim 3, wherein the plurality of inner electrode pads further includes a plurality of electrode pads positioned inside the plurality of third inner electrode pads on the semiconductor chip.

5. The semiconductor device according to claim 1, wherein the inner electrode pads positioned closer to an innermost portion of the semiconductor chip have larger areas.

6. The semiconductor device according to claim 1, wherein the bumps adjacent to each other are distant substantially equally in an alignment direction of the plurality of end electrode pads.

* * * * *